(12) United States Patent
Sakamoto

(10) Patent No.: US 6,740,907 B2
(45) Date of Patent: May 25, 2004

(54) JUNCTION FIELD-EFFECT TRANSISTOR

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/263,800

(22) Filed: Oct. 4, 2002

(65) Prior Publication Data

US 2004/0065896 A1 Apr. 8, 2004

(51) Int. Cl.[7] .............................................. H01L 29/74
(52) U.S. Cl. ...................... 257/134; 357/20; 357/22; 357/34; 357/43; 357/46; 357/48; 307/450
(58) Field of Search .................. 357/43, 20, 22, 357/34, 46, 48; 307/450

(56) References Cited

U.S. PATENT DOCUMENTS 4,095,252 A * 6/1978 Ochi ......................... 257/273
4,654,548 A * 3/1987 Tanizawa et al. ........... 326/122

* cited by examiner

Primary Examiner—David Nelms
Assistant Examiner—Mai-Huong Tran
(74) Attorney, Agent, or Firm—Rabin & Berdo, P.C.

(57) ABSTRACT

A junction field-effect transistor is formed by providing a p-type gate region in a surface of an n-type semiconductor layer and n-type drain and source regions sandwiching the gate region on the surface of the n-type semiconductor layer. A p-type diffusion region is formed at least in the region on the side of the drain close to the gate region on the surface of the n-type semiconductor layer. A drain electrode is formed so that it contacts with the p-type diffusion region. As a result, the junction FET can be reduced in drain-source leak current $I_{dss}$ to a small, stable value. Thus, a high-gain junction field-effect transistor is obtained which has small variation in performance among actual units manufactured.

10 Claims, 4 Drawing Sheets

JUNCTION FIELD-EFFECT TRANSISTOR

FIELD OF THE INVENTION

This invention relates to junction a field-effect transistor and, more particularly, to a junction field-effect transistor having a gate-source connection in which drain-source leak current $I_{dss}$ is decreased, thereby improving FET performance in such factors as gain.

BACKGROUND OF THE INVENTION

The junction FET is formed with a $p^+$-type gate region 23 diffused on an $n^-$-type semiconductor layer 22 epitaxially grown, for example, on a $p^+$-type semiconductor substrate 21, and an $p^-$-type drain region 24 and source region 25 diffused on both sides thereof, as shown in the cross sectional explanatory view FIG. 5A. It is noted that the semiconductor substrate 21 is connected to the gate electrode 26 and not-shown $p^+$-type diffusion region (channel stop) through an interconnection to have, on a back surface thereof, a gate electrode 26a for connection onto a die pad. In FIG. 5A, 26 is a gate electrode, 27 a drain electrode, 28 a source electrode and 30 an insulating film on a surface of the semiconductor layer 2.

In this structure, the current between the drain and the source is controlled and amplified depending upon a magnitude of the voltage applied to the gate region 23. It is known that, the amplification characteristic of this transistor has a close bearing on the drain-source leak current $I_{dss}$ that arises when a voltage V between the drain D and the source S is applied in the case that the gate G and the source S are connected together, as shown in FIG. 5B.

In the junction FET of this kind, the drain-source leak current $I_{dss}$ is preferably small and low in variation in order that an FET having a high, stable gain may be obtained, as noted before. However, the current A flowing near a surface of the semiconductor layer 22 and the current B flowing within the semiconductor layer 22 have current variations caused due to the presence of an impurity concentration gradient in the diffusion region, such as the drain region 24, and semiconductor layer 22 (diffusion region with high impurity concentration particularly nearby the surface). There tends to be great variation among particular manufacture lots. This results in a problem that there is gain decrease or variation in characteristics depending upon the manufacture lot, thus making it impossible to obtain a junction FET having a high gain with stable characteristics. Note that a spread of the depletion layer is shown at C in FIG. 5A.

SUMMARY OF THE INVENTION

The present invention has been made in order to solve the foregoing problem, and it is an object thereof to provide a high-gain junction field-effect transistor which has low variation in characteristics by reducing the junction-FET drain-source leak current $I_{dss}$ to a small, stable value.

A junction field-effect transistor of the invention is a junction field-effect transistor comprising a gate region in a second conductivity type provided on a surface of a first conductivity type semiconductor layer, drain and source regions of a first conductivity type provided sandwiching the gate region on the surface of the first conductivity type semiconductor layer, a gate electrode, a drain electrode and a source electrode respectively connected to the gate region, the drain region and the source region, wherein a diffusion region of the second conductivity type is formed on the surface of the first conductivity type semiconductor layer at least on the region at the side of the drain region close to the gate region in order to be connected to the drain electrode or in a region between the drain and gate regions not connected to the drain electrode.

This structure forms a diffusion region having a conductivity type different from the drain and source regions at the side of the drain region close to the gate region in a semiconductor layer surface where impurity concentration variation tends to occur and leak current readily flows, thus operating as an FLR (field limiting ring). A depletion layer is thus formed at the surface of the epitaxially grown semiconductor layer of the drain and source regions along with the gate region, there by preventing current flow. Thus almost no leak current flows near the surface of the semiconductor layer. As a result, the leak current $I_{dss}$ between the drain and the source, where the gate and the source are connected, can be suppressed to a stable, small value. This brings about a stable gain and greatly improves the performance of the FET.

DETAILED DESCRIPTION

Figure 1A:
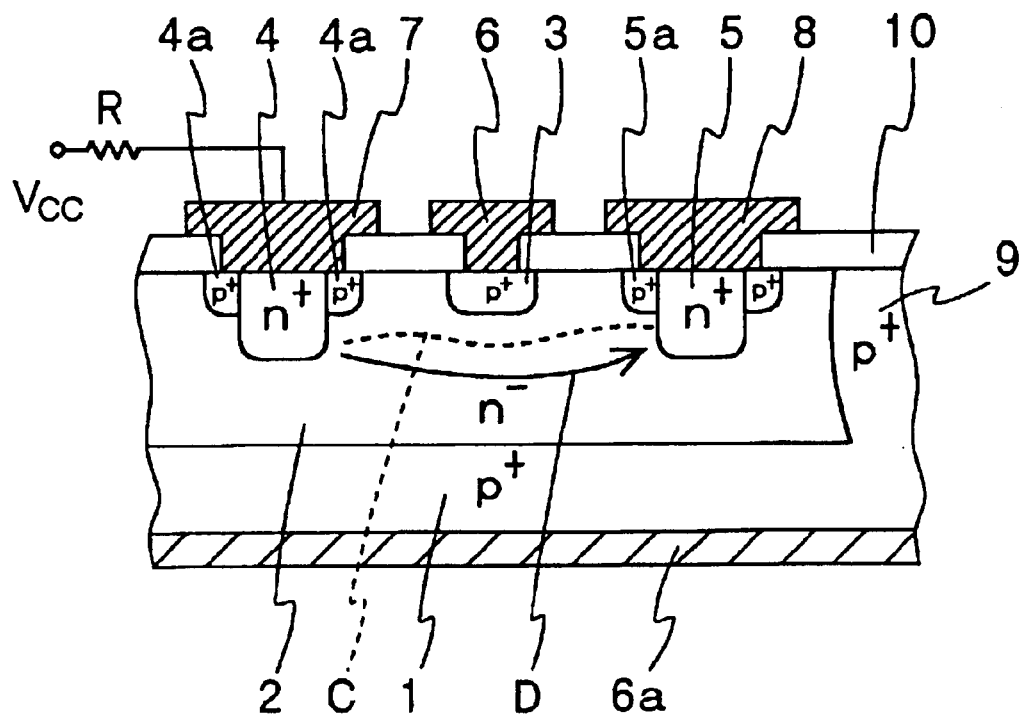
FIGS. 1A and 1B are views explaining one embodiment of a junction field-effect transistor according to the present invention.

Explanation will be now made of a junction field-effect transistor of the present invention with reference to the drawings. The junction field-effect transistor of the invention has a gate region 3 of a second conductivity type (p-type) on the surface of a first conductivity type (n-type) semiconductor layer 2, and $n^+$-type drain region 4 and source region 5 sandwiching the gate region 3 on the surface of the n-type semiconductor layer 2, as shown in the cross sectional explanatory view of one embodiment of FIG. 1A, thus forming a junction field-effect transistor. A p-type diffusion layer 4a is formed on the surface of the n-type semiconductor layer 2 at least on the side of the drain region 4 close to the gate region 3. A drain electrode 7 is formed so that it is connected with the p-type diffusion region 4a.

Figure 2:
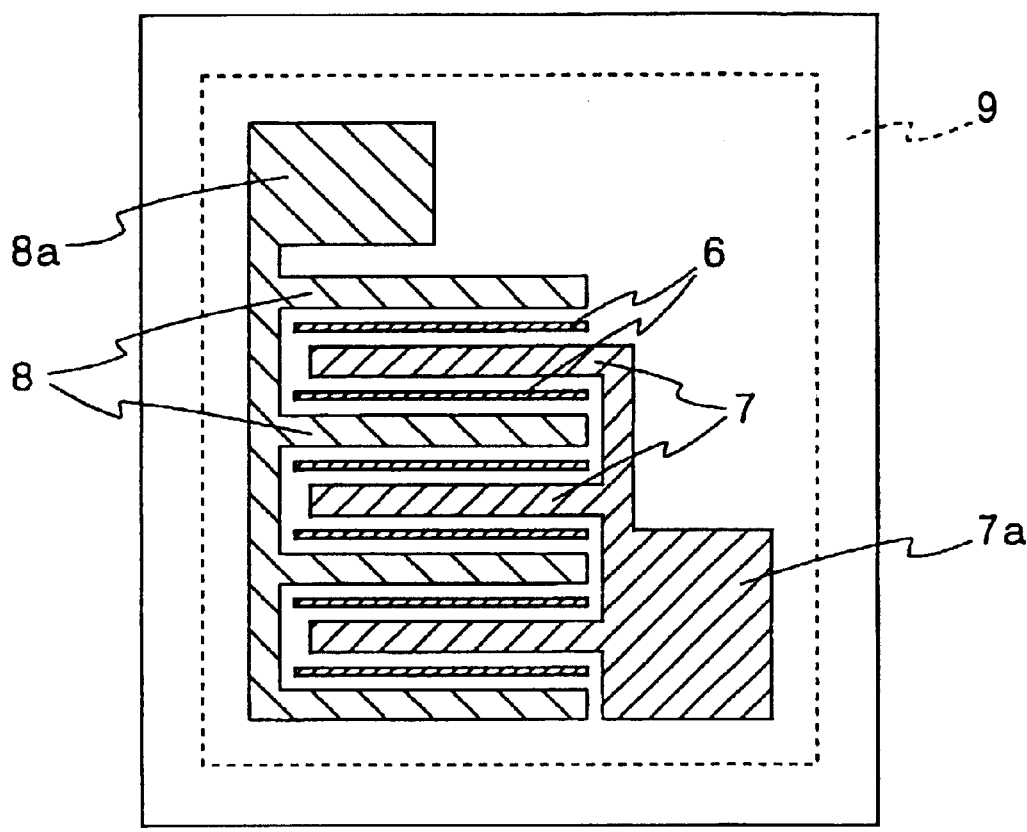
FIG. 2 is a plan explanatory view showing the electrode pattern of the transistor shown in FIG. 1.

The example shown in FIG. 1A is an example having a drain and a source on the respective sides of each stripe-formed gate as shown in a plan explanatory view of FIG. 2, a part of which is shown in sectional view in FIG. 1A. In FIG. 2, 6 represents a gate electrode, 7 a drain electrode, 7a a drain electrode pad, 8 a source electrode, 8a a source electrode pad and 9 a channel stopper.

Referring back to FIG. 1A, the semiconductor substrate 1 uses a $p^+$-type silicon semiconductor substrate having an impurity concentration, e.g., of approximately $1 \times 10^{19}$ cm$^{-3}$. This has, on the surface, an n-type epitaxial growth layer 2 of approximately 6 μm grown with an impurity concentration of approximately $2 \times 10^{15}$ cm$^{-3}$. To a region of the surface is diffused a p-type impurity, such as boron, to form a gate region 3 with an impurity concentration of approximately $1 \times 10^{19}$ cm$^{-3}$ having a width of approximately 5 μm and a depth of approximately 4 μm. An n-type impurity is diffused to the regions on respective sides of and spaced by approximately 10 μm from the gate region 3, to from a drain region 4 and a source region 5 each having an impurity concentration of $1 \times 10^{18}$ cm$^{-3}$ and a width of approximately 5 μm and a depth of 5 μm.

The present invention is characterized in that a p$^+$-.type diffusion region 4a is formed in the region at the side of the drain region 4 close to the gate region 3, to a width of approximately 4 μm and a depth nearly equal to that of the gate region 3, wherein a drain electrode 7 is connected not only with the drain region 4 but also with the p$^+$-type diffusion region 4a. In the example shown in FIG. 1A, a p$^+$-type diffusion region 5a is also formed in the region on a side of the source region 5 close to the gate region 3, in addition to the drain region 4. As shown in FIG. 2, because of the sequential arrangement formation, i.e. gate region (gate electrode 6), drain region (drain electrode 7), gate region (gate electrode 6), source region (source electrode 8) and gate region (gate electrode 6), the gate regions 3 exist on both sides of the drain region 4 or source region 5. As shown in FIG. 1A, p$^+$-type diffusion regions 4a, 5a are formed respectively on both sides of the drain region 4 and the source region 5. The drain electrode 7 and the source electrode 8 are provided respectively connected also with the p$^+$-type diffusion regions 4a, 5a.

The p$^+$-type diffusion regions 4a, 5a can be formed, during forming a gate region 3, by forming openings on both sides of the drain region 4 and source region 5 to carry out diffusion simultaneous with that for a gate region 3. Note that the depth must be shallower than a diffusion depth for drain region 4 or source region.

Figure 3:
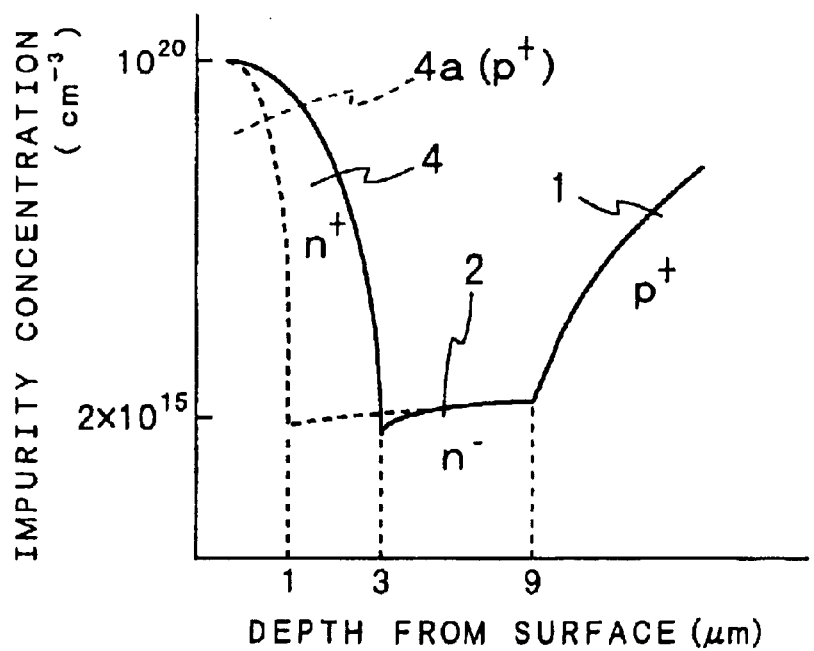
FIG. 3 is a figure showing the profile of an impurity with respect to a depth from the surface of a semiconductor layer of FIG. 1.

FIG. 3 shows a diffusion profile in the depthwise direction from the surface of the p$^+$-type diffusion region 4a, 5a and drain/source region 4, 5 down to the semiconductor substrate 1. It is seen that impurity concentration is extremely high close to the surface of the diffusion region but greatly decreased as the depth increases. At the lower surface there is the impurity concentration of the semiconductor layer 2 which is an epitaxial growth layer. At a further depth is a p$^+$ type semiconductor substrate 1. However, at a junction of these, the impurity concentration decreases under the influence of the n type of the semiconductor layer 2. As the bottom surface of the semiconductor substrate 1 is neared, the impurity concentration increases to the substrate impurity concentration. Note that 4, 4a, 2 and 1 denote the respective impurity concentrations in the drain region, the p$^+$-type diffusion region, the semiconductor layer and the semiconductor substrate.

In the peripheral region of the semiconductor chip, an impurity having the same conductivity type as the semiconductor substrate 1, e.g. boron, is diffused in a manner reaching the semiconductor substrate 1, thus forming a channel stop 9. Then the channel stop 9 and the gate region 3 are connected together. The semiconductor substrate 1 has, on a back surface, an electrode 6 to be die-bonded, as a gate electrode, onto a die pad or the like. Incidentally, an insulating film 10 is provided on the surface of the semiconductor layer and the gate electrode 6, the drain electrode 7 and the source electrode 8 are provided so that they have ohmic contact through contact holes. Although the semiconductor substrate in FIG. 1 is depicted with a reduced thickness, it actually is by far greater in thickness than the semiconductor layer 2.

Figure 1B:
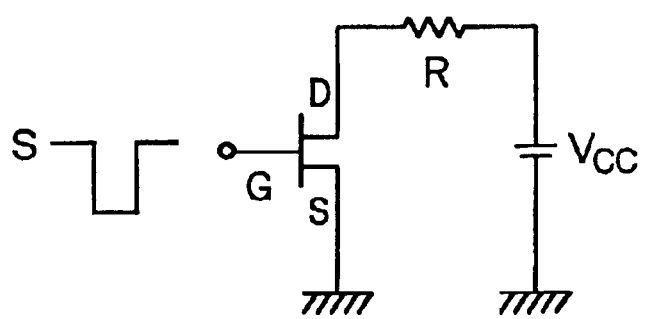

This junction FET, as shown in an equivalent circuit diagram of FIG. 1B, is source-grounded having a power source Vcc connected between the drain and the ground, with a load resistance R between power source Vcc and the drain, so that amplification can be made by inputting a signal S to the gate.

The operation of the p$^+$-type diffusion region 4a will now be explained. Due to the formation of the p$^+$-type diffusion region 4a, when a bias voltage is applied to the gate electrode 6, a depletion layer C extends to the drain region 4 thus covering over the entire area between the drain region 4 and the source region 5 so that there is hardly any current flowing in the surface of the semiconductor layer 2. Instead, the current between the drain and the source, shown as D in FIG. 1A, stabilizes. Thus, the current is stable, almost entirely free from the influence of impurity concentration variation in the surface of the diffusion regions 4, 5 and semiconductor layer 2. Namely, in the conventional structure, when a bias is applied to the gate, a leak current is readily caused by deformations arising in the depletion layer because this creates a difference in thickness of regions thereof. In the invention, however, the depletion layer is allowed to stably extend between the source and the drain, so that the leak current $I_{dss}$ is reduced to conspicuously improve amplification characteristic.

Incidentally, regarding a drain-source leak current $I_{dss}$ arising between the gate and the source when these two are connected, the p$^+$-type diffusion region 5a close to the source region 5 is unaffected by the presence or absence thereof. In the case the gate and the source are not connected as is the usual operating state, it can be similarly made free from the effect of surface current, thus greatly contributing to performance improvement. Accordingly, as shown in FIG. 1, it is preferred to form a p$^+$-type diffusion region 5a also at the side of the source region 5 close to the gate region 3.

Figure 4:
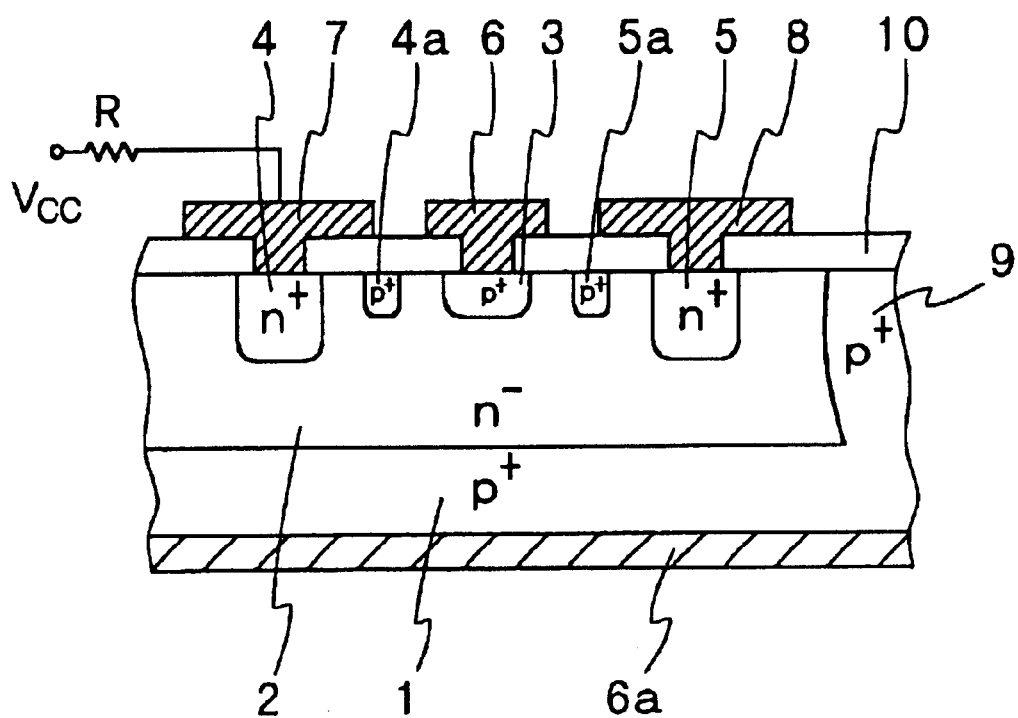
FIG. 4 is a sectional explanatory view similar to FIG. 1A, showing another embodiment of the present invention.
Figure 5A:
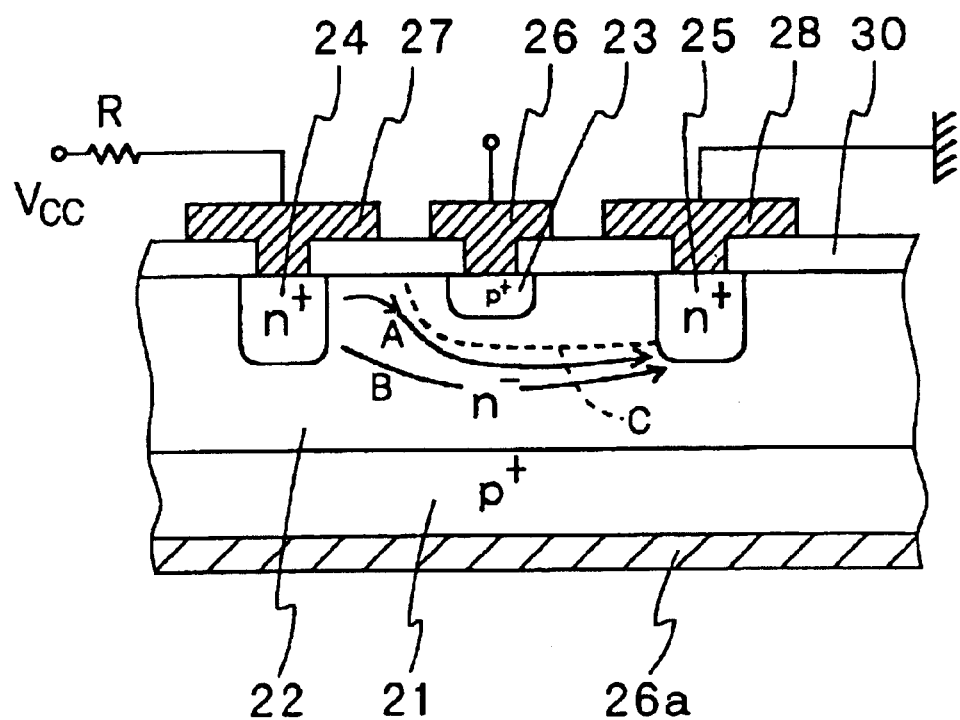
FIGS. 5A and 5B are a view showing a sectional explanatory view of a conventional junction FET and the relationship between a leak current $I_{dss}$ and a voltage gain.
Figure 5B:
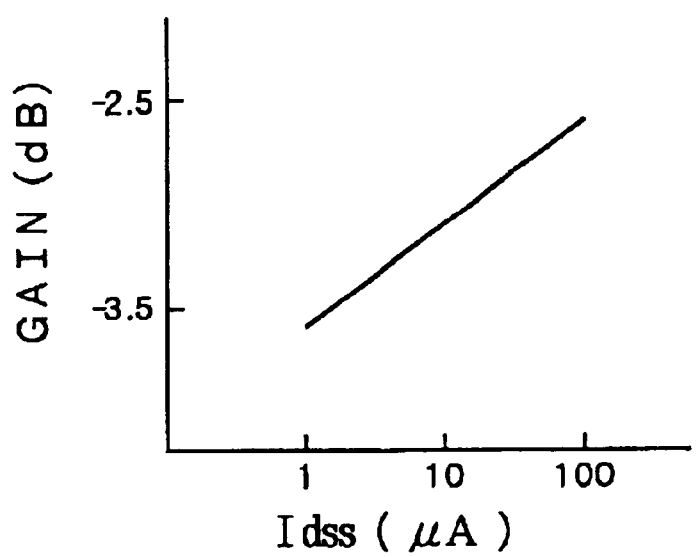

In the foregoing example, the p$^+$-type diffusion regions 4a and 5a are formed to contact respectively with the drain region 4 and the source region 5 and connected with the drain electrode 7 and the source electrode 8. However, as shown in FIG. 4, even if the p$^+$-type diffusion regions 4a, 5a are formed between the drain region 4 and the gate region 3 or between the source region 5 and the gate region 3 instead of being connected with the drain electrode 7 or source electrode 8, it can operate as an FLR similarly to the example shown in FIG. 1. Because the depletion layer stably extends between the drain and the source, the leak current $I_{dss}$ is decreased to greatly improve amplification characteristics. Incidentally, the same elements as those of FIG. 1 are given the same reference numbers and explanations thereof are here omitted. Also in this example, it is preferred to provide p$^+$-type diffusion regions particularly between the drain and gate regions as in the foregoing example, in order to reduce the leak current $I_{dss}$. However, the characteristics can be further improved by providing p$^+$-type diffusion regions also between the source and gate regions.

According to the present invention, because the junction FET can be reduced in leak current and variation in impurity concentration in the surface can be prevented from readily occurring in particular manufacture lots, it is possible to greatly reduce the variation in drain-source leak current $I_{dss}$. As a result, a junction FET can be obtained which is stable in characteristics, improved in reliability and high in voltage amplification ratio.

What is claimed is:

1. A junction field-effect transistor comprising:
   a semiconductor layer of a first conductivity type;
   a gate region of a second conductivity type provided on a surface of the first conductivity type semiconductor layer;
   drain and source regions of the first conductivity type provided on the surface of the first conductivity type semiconductor layer and sandwiching the gate region;
   a gate electrode, a drain electrode and a source electrode respectively connected to the gate region, the drain region and the source region; and
   a first diffusion region of the second conductivity type provided on the surface of the first conductivity type semiconductor layer, disposed between the drain region and the gate region.

2. A junction field-effect transistor according to claim 1, wherein the first diffusion region of the second conductivity type provided on the surface of the first conductivity type semiconductor layer, is disposed adjacent to the drain region.

3. A junction field-effect transistor according to claim 1, further comprising a second diffusion region of the second conductivity type provided on the surface of the first conductivity type semiconductor layer, disposed between the source region and the gate region.

4. A junction field-effect transistor according to claim 3, wherein the second diffusion region of the second conductivity type provided on the surface of the first conductivity type semiconductor layer, is disposed adjacent to the source region.

5. A junction field-effect transistor according to claim 1, wherein the drain electrode is connected not only to the drain region but also to the first second conductivity type diffusion region.

6. A junction field-effect transistor according to claim 1, wherein the first second conductivity type diffusion region is formed so as to not be connected with the drain electrode.

7. A junction field-effect transistor according to claim 3, wherein the source electrode is connected not only to the source region but also to the second second conductivity type diffusion region.

8. A junction field-effect transistor according to claim 3, wherein the second second conductivity type diffusion region is formed so as not to be connected with the source electrode.

9. A junction field-effect transistor according to claim 1, wherein the gate regions are arranged in plurality in a stripe form, the drain region or source region being provided between adjacent gate regions to form the regions in the following order on the surface of the first conductivity type semiconductor layer: drain, gate, source, gate, drain.

10. A junction field-effect transistor according to claim 1, wherein the first second coductivity type diffusion region is formed shallower than a diffusion depth of the drain region and the source region.

* * * * *